(12) United States Patent
Kim

(10) Patent No.: US 9,865,991 B2
(45) Date of Patent: Jan. 9, 2018

(54) LASER DEVICE WITH OPTICAL ISOLATOR

(71) Applicant: PHOVEL.CO.LTD., Daejeon (KR)

(72) Inventor: Jeong-Soo Kim, Sejong-si (KR)

(73) Assignee: PHOVEL.CO.LTD., Yuseong-gu, Daejeon (KR)

(*) Notice: Subject to any disclaimer, the term of this patent is extended or adjusted under 35 U.S.C. 154(b) by 0 days.

(21) Appl. No.: 15/255,970

(22) Filed: Sep. 2, 2016

(65) Prior Publication Data

US 2017/0310084 A1 Oct. 26, 2017

(30) Foreign Application Priority Data

Apr. 25, 2016 (KR) .......................... 10-2016-0050284
Jun. 24, 2016 (KR) .......................... 10-2016-0079313

(51) Int. Cl.
*H01S 5/0687* (2006.01)
*H01S 5/10* (2006.01)
*H01S 5/022* (2006.01)

(52) U.S. Cl.
CPC ............ *H01S 5/10* (2013.01); *H01S 5/02212* (2013.01); *H01S 5/0687* (2013.01)

(58) Field of Classification Search
CPC ....... H01S 5/02212; H01S 5/0687; H01S 5/10
USPC ................................ 372/32, 20, 18; 359/479
See application file for complete search history.

(56) References Cited

U.S. PATENT DOCUMENTS

| 8,199,785 | B2 | 6/2012 | Zheng et al. | |
|---|---|---|---|---|
| 2002/0186729 | A1* | 12/2002 | Nasu | H04B 10/572 372/34 |
| 2003/0185259 | A1* | 10/2003 | Gamache | G01J 1/4257 372/32 |
| 2015/0200730 | A1* | 7/2015 | Kim | H01S 5/02248 372/20 |

* cited by examiner

*Primary Examiner* — Tuan Nguyen
(74) *Attorney, Agent, or Firm* — Davis & Bujold PLLC; Michael J. Bujold

(57) ABSTRACT

Disclosed herein is a technology of effectively interrupting light reflected from a wavelength selective filter so as not to be fed back to a laser diode chip in a semiconductor laser package having a function of adjusting a relative intensity ratio of a signal of "1" and a signal of "0" using an optical filter. Since an optical interruption device according to the present invention may effectively interrupt a light feedback to the laser diode chip by adjusting characteristics of a 45 degree partial reflection mirror in an existing TO-can type laser device having the 45 degree partial reflection mirror and additionally disposing one λ/4 waveplate, unlike an optical isolator according to the related art using an existing Faraday rotator, the signals of "1" and "0" may be effectively adjusted in a TO-can type laser device having a small volume, thereby improving a function of communication.

10 Claims, 5 Drawing Sheets

[FIG. 1]
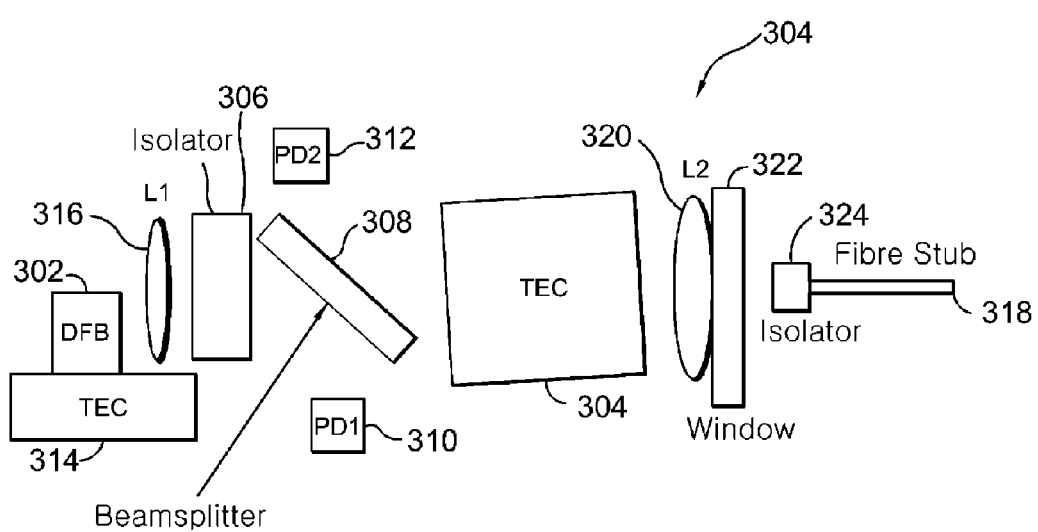

[FIG. 2]
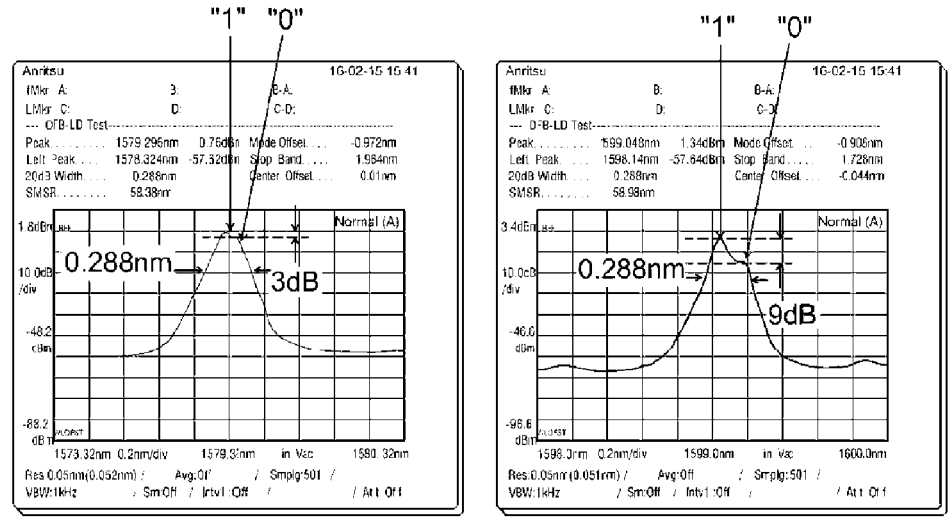
[FIG. 3]
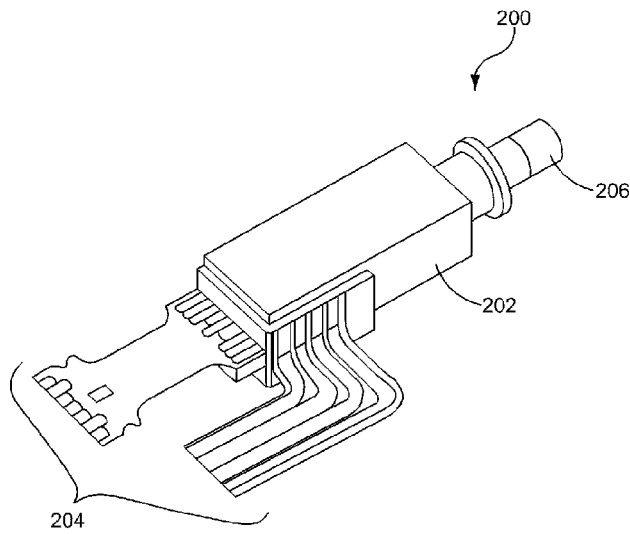

[FIG. 4]
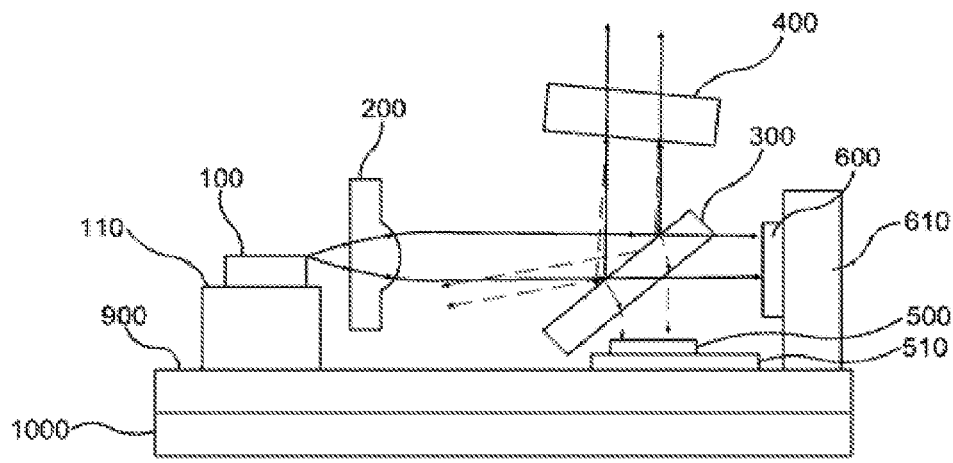
[FIG. 5]
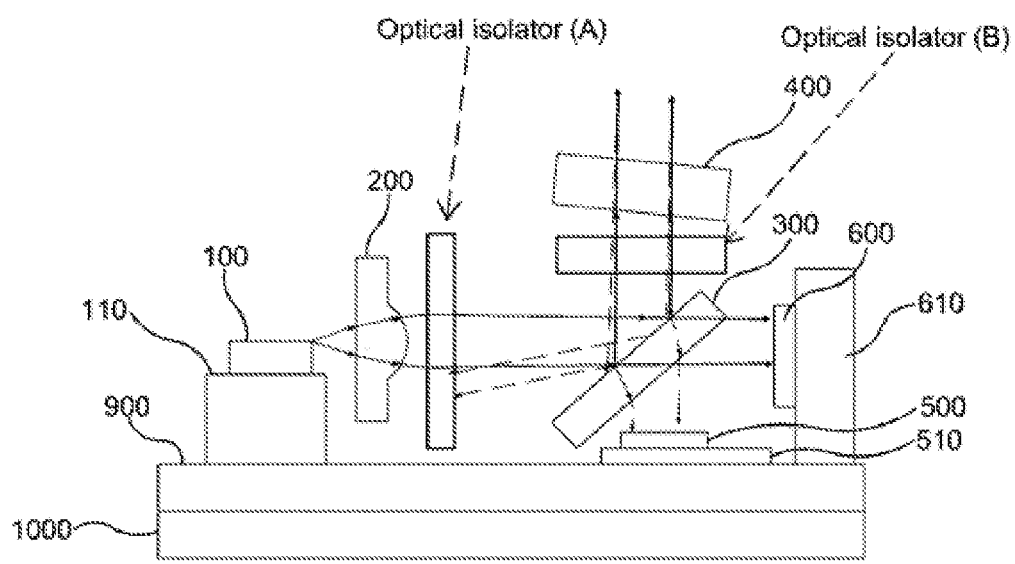

[FIG. 6]
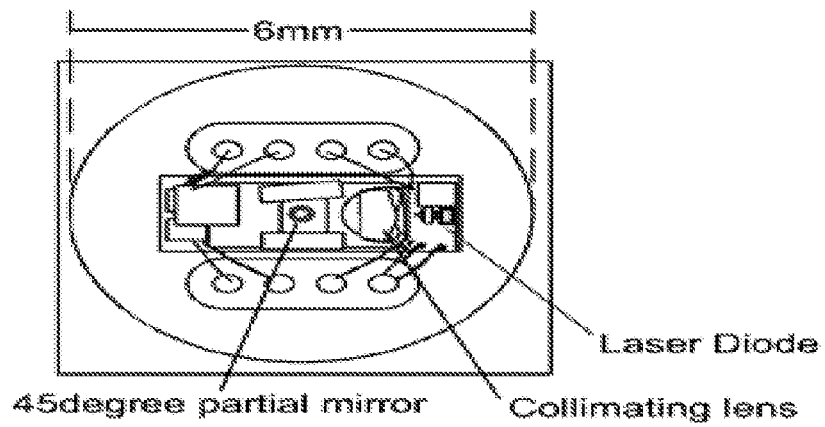
[FIG. 7]
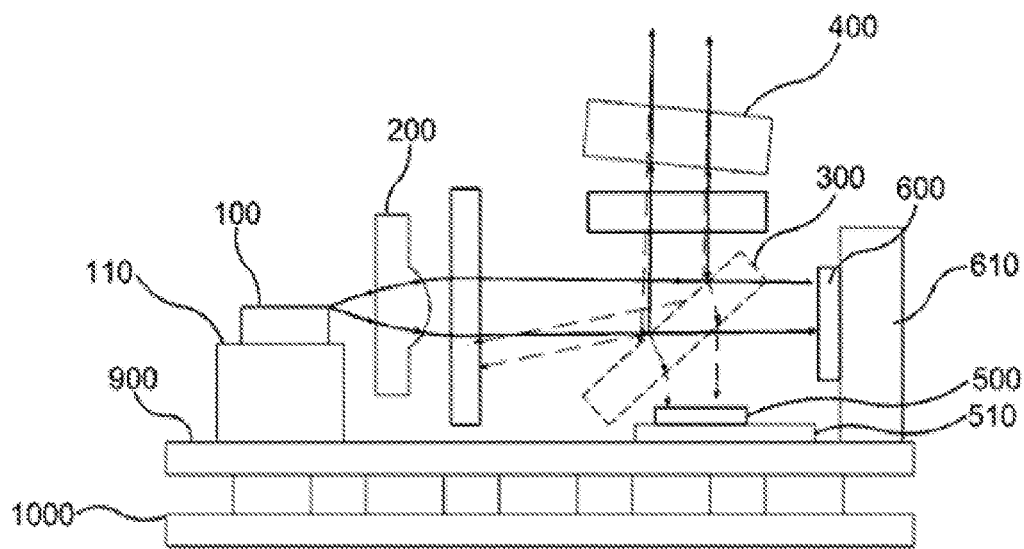

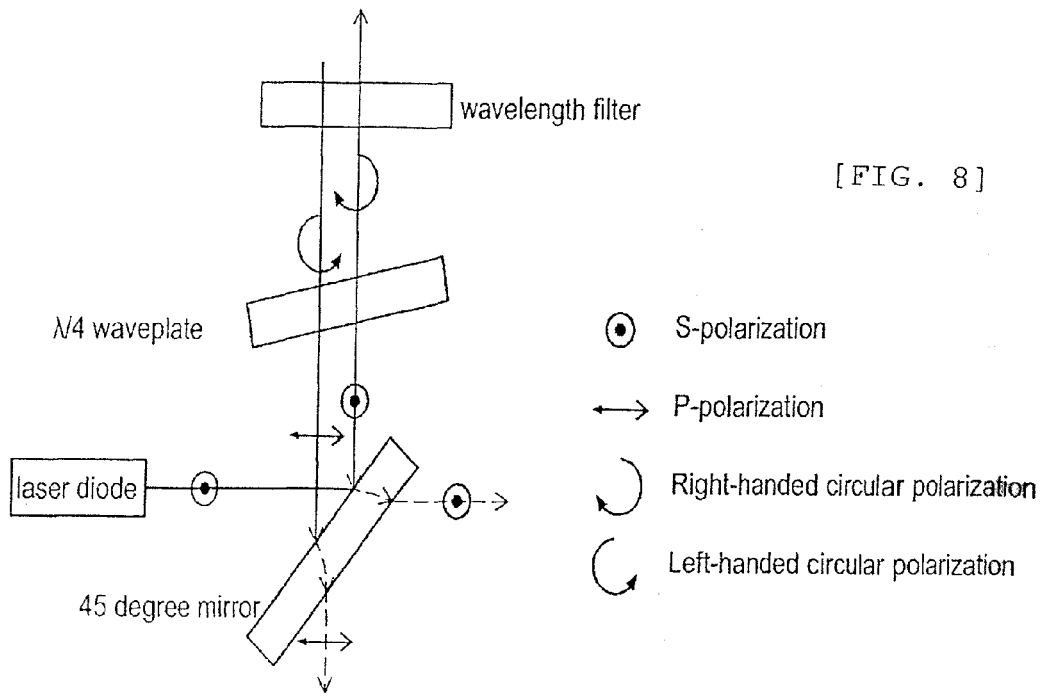
[FIG. 8]
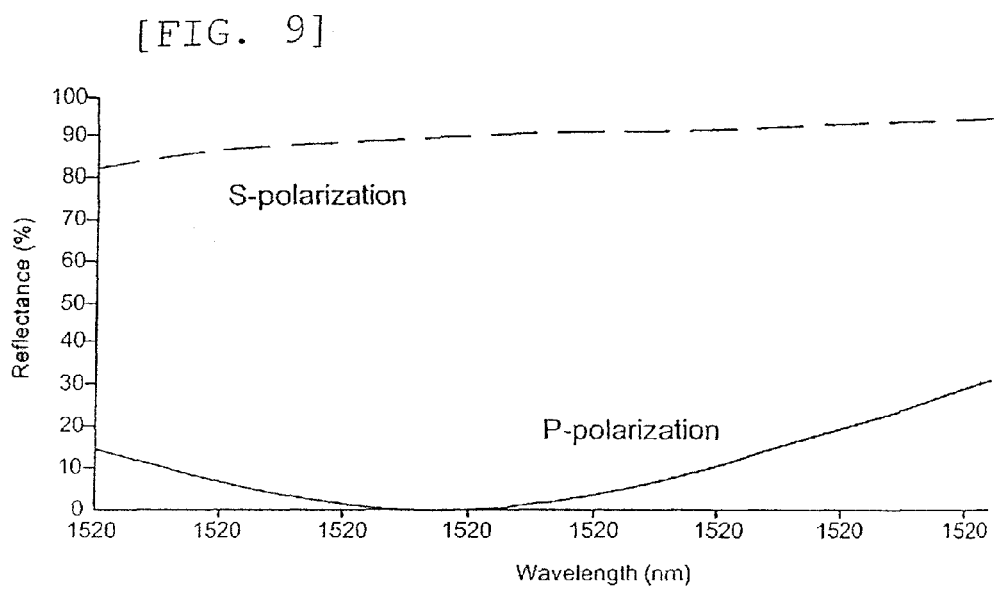
[FIG. 9]

LASER DEVICE WITH OPTICAL ISOLATOR

RELATED APPLICATIONS

This application claims priority to Korean Patent Application No. 10-2016-0050284, filed on Apr. 25, 2016 and No. 10-2016-0079313, filed on Jun. 24, 2016 which is herein incorporated by reference in its entirety.

BACKGROUND

Field

The present invention relates to a TO-can type laser device, and more particularly, to a TO-can type laser device having an optical isolator function that prevents light emitted from a laser diode chip from being again returned to the laser diode chip therein.

Description of the Related Art

Communication services having very large communication capacity including a video service of a smartphone, or the like have recently been released. Accordingly, a need to significantly increase conventional communication capacity is emerged, and as a method of increasing communication capacity using an optical fiber which is conventionally installed, a communication scheme of dense wavelength division multiplexing (DWDM) has been adopted. The DWDM refers to a method of simultaneously transmitting lights at various wavelengths through one optical fiber using a phenomenon that does not cause interference between optical signals even if the optical signals of several wavelengths are simultaneously transmitted through one optical fiber due to a fact that laser lights having different wavelengths do not interfere with each other.

Recently, a standard called Next Generation—Passive Optical Network version 2 (NG-PON2) has globally been negotiated, and in the NG-PON2 standard, as a standard of optical communication module to be installed in a subscriber, laser of a frequency interval of 100 GHz has been adopted. An optical module for a subscriber of the NG-ON2 has a transceiver module called small form factor pluggable (SFP) as a basic standard. Since a volume of an SFP module package is small, a size of a laser module should be miniaturized.

In addition, in digital optical communication in which a signal of "1" and a signal of "0" are distinguished depending on intensity of light emitted from the laser diode chip, the signal of "1" and the signal of "0" are adjusted by the intensity of light emitted from a semiconductor laser diode chip. The intensity of light emitted from the semiconductor laser diode chip is varied depending on intensity of a current injected into the semiconductor laser diode chip, and a chirp phenomenon occurs in which a wavelength of chip laser light is varied depending on the intensity of current the current injected into the semiconductor laser diode chip. In a high speed operation of 10 Gbps, the chirp phenomenon occurs in which spectrum of the laser light emitted from the laser diode chip is widened, and the above-mentioned chirp phenomenon has a disadvantage that it is combined with dispersion characteristics of the optical fiber thereby shorten a transmission distance of an optical signal.

The above-mentioned chirp phenomenon is combined with dispersion characteristics of the optical fiber to thereby make a long distance transmission of a high speed optical signal difficult. In order to decrease the chirp phenomenon, a method of decreasing a modulation width of the current injected into the semiconductor laser diode chip generating the signal of "1" and the signal of "0" may be used. However, in the case of using this method, since a difference between intensities of the signal of "1" and the signal of "0" is decreased, a problem that it is difficult to distinguish the signals occurs, In order to solve the above-mentioned problem, a method has been used in which light corresponding to a wavelength of the signal of "0" of the laser diode chip is optically decreased to electrically drive the laser diode chip so that the modulation width of the current is not large and to then optically emphasize the difference between the intensities of the signal of "1" and the signal of "0".

FIG. 1 shows a structure of a chirp managed laser described in U.S. Pat. No. 8,199,785. The chirp managed laser uses a method of selectively decreasing light corresponding to the signal of "0" using an optical filter to increase a modulation width of a final output signal. Here, since the laser light oscillated from the semiconductor laser diode chip has a change of a wavelength of about 0.1 nm/°C. depending on a temperature, and the optical filter should selectively decrease only the signal of "0", there is a problem that wavelengths of light emitted from the optical filter and the semiconductor laser diode chip need to be precisely matched to each other. For this reason, a wavelength stabilizer is essential in the chirp managed laser, and reference numerals 308, 310, and 312 of FIG. 1 denote structures for wavelength stabilization described above. FIGS. 2 show a view (FIG. 2A) showing a ratio of intensities of signal wavelengths of the signal of "1" and the signal of "0" in a case in which the optical filter is not used, and a view (FIG. 2B) showing a ratio of intensities of signal wavelengths in a case in which a difference between the intensities of the signal of "1" and the signal of "0" is expanded using the optical filter that relatively well passes the intensity of the signal of "1" and relatively interrupts the intensity of the signal of "0".

In order to use the wavelength stabilizer of FIG. 1, a portion of the light emitted DFB-LD 302 (FIG. 1) needs to be reflected from OSR 304 (FIG. 1) and to be again moved in a direction of the DFB-LD 302 (FIG. 1). In particular, in a case in which the optical filter has characteristics of etalon, since characteristics of the etalon optical filter become good when the etalon optical filter is disposed so that incident light is incident to be almost vertical to an incident surface of the etalon optical filter, most of the etalon optical filters are designed so as to correspond to light entering the incident surface of the etalon optical filter at a narrow angle of about +/−3 degrees of a vertical angle. Light reflected vertically from the etalon filter may be fed back to the laser diode chip to thereby disturb an operation of the laser diode chip. However, since the DFB-LD 302 (FIG. 1) has characteristics which very sensitively change for light entered from the outside, a method is required that allows light moved from the OSR 304 (FIG. 1) to the DFB-LD 302 (FIG 1.) to be moved in PD 312 (FIG. 1), and not to be moved in DFB-LD 302 (FIG. 2). According to the relate art of FIG. 1, an optical isolator 306 (FIG. 1) that passes light only in one direction and does not pass the light in an opposite direction is disposed.

In FIG. 1, two optical isolators are shown, in which the optical isolator 306 (FIG. 1) has a function of blocking the light emitted from the laser diode chip and reflected from a wavelength selective filter 304 (FIG. 4) so as not to be fed back to the laser diode chip, and another optical isolator 324 (FIG. 1) is an optical isolator for blocking light injected into an optical element of FIG. 1 through an optical fiber from another optical element.

Since the optical isolator includes two polarizers, a Faraday rotator disposed between the two polarizers, and a permanent magnet applying a magnetic field to the Faraday rotator, the optical isolator has a problem that it is complex and expensive.

In FIG. 1, the laser light emitted from the semiconductor laser diode chip 302 (FIG. 1) goes straight to be incident on an optical fiber 318 (FIG. 1), and this type of configuration is most preferably implemented by FIG. 3 of U.S. Pat No. 8,199,785 according to the related art, which is called a mini-flat type. However, since an optical element package housing of the mini-flat type is expensive, a method of implementing the wavelength stabilizer using a TO-can type package which is inexpensive is shown in US20150200730 of FIG. 4. As the TO-can type, a small product typically having a diameter within 6 mm is mainly applied to optical communication. The reason that a size of 6 mm is important in the TO-can type package having the diameter of 6 mm or less is because a height of a package of an SFP type transceiver, which is the most important standard of a current optical transceiver for communication is about 8 mm, and only the TO-can type package having the maximum diameter of 6 mm is allowable to be mounted within the above-mentioned package.

In US20150200730 of FIG. 4, when a filter 400 is mounted within the above-mentioned. package, used as the optical filter, the chirp managed laser having the wavelength stabilizer embedded therein may be implemented in the TO-can type. However, since the case of FIG. 4 does not have a device that prevents the feedback of the light such as the optical isolator 306 (FIG. 1) shown in U.S. Pat. No. 8,199,735 of FIG. 1, a portion of light emitted from the laser diode chip 100 (FIG. 4), entering an optical filter 400 (FIG. 4), reflected from the optical filter 400 (FIG. 4) and then again moved to a 45 degree partial reflection mirror 300 (FIG. 4) is reflected from the partial reflection mirror 300 (FIG. 4) to enter the semiconductor laser diode chip 100 (FIG. 4), thereby making it possible to disturb an operation of the semiconductor laser diode chip 100 (FIG. 4). In the case of FIG. 4, in order to obtain strong light intensity, the 45 degree partial reflection mirror 300 (FIG. 4) may reflect most of the incident light. Therefore, since most of the light reflected From the optical filter 400 (FIG. 4) to arrive at the 45 degree partial reflection mirror 300 (FIG. 4) is reflected to the laser diode chip 100 (FIG. 4), the operation of the laser diode chip 100 (FIG. 4) is more easily disturbed.

In the case of FIG. 4, as a type in which the optical isolator may be disposed, a method of disposing the optical isolator at a position of an optical isolator (A) of FIG. 5 is possible. However, it is very difficult to apply this method to a limited size of the diameter of substantially 6 mm.

FIG. 6 shows a TO-can internal structure of a structure of FIG. 4 manufactured in the TO-can type having a diameter of substantially 6 mm. In a case in which an outer cap portion of a package in a TO-can type package having the diameter of 6 mm is considered, a space in which a past may be disposed in the TO-can type package is limited to 4 mm or less. In FIG. 6, a size of a collimating lens is 0.7 mm, and in a case in which the size of the lens is decreased to 0.7 mm or less, since a size of a collimated beam becomes too small, characteristics of transmission/interruption by interference in the etalon filter do not exhibit well. In the TO-can type, since the collimated light is preferably emitted in a concentric axis of the TO-can type package, the 45 degree partial reflection mirror is preferably disposed on the concentric axis of the TO-can type package. As shown in FIG. 6, since the TO-can type package having the diameter of 6 mm has a very small size, a problem occurs that a space in which an optical isolator typically having a size of 1 mm or more is to be mounted is insufficient. Therefore, it is substantially impossible to dispose the optical isolator at the position (A) of FIG. 5. In the TO-can type package, the optical isolator such as the optical isolator (B) of FIG. 5 may be disposed without limiting the size of the package in a vertical upward direction of the 45 degree partial reflection mirror to thereby prevent the light reflected from the optical filter 400 (FIG. 5) from being fed back to the laser diode chip 100 (FIG. 5). However, in this case, since light to be incident to a photo diode 500 (FIG. 5) is also interrupted by the optical isolator (B), by which the wavelength stabilizer is not used, the function of the chirp managed laser may not be implemented.

SUMMARY

An object of the present invention is to provide a method of implementing chirp managed laser enabling high-speed and long distance communications using a TO-can type semiconductor laser package having a subminiature diameter, and particularly, to provide a method of removing an optical feedback in which light reflected by a wavelength selective filter is returned to a laser diode chip to cause operation characteristics of the laser diode chip to be unstable Another object of the present invention is to provide a method of effectively implementing a function of an optical isolator using a wavelength selective filter, which is one optical plate, instead of the optical isolator that includes two polarizers, a Faraday rotator disposed between the two polarizers, and a permanent magnet apply a magnetic field to the Faraday rotator, has a large size, and is expensive.

According to an exemplary embodiment of the present invention, there is provided a laser device including: a laser diode chip configured to emit laser light; a wavelength selective filter; a collimating lens configured to be installed on an optical path between the laser diode chip and the wavelength selective filter to collimate the light emitted from the laser diode chip; a 45 degree partial reflection mirror configured to be installed on an optical path between the collimating lens and the wavelength selective filter to convert a direction of laser light which is moved to be horizontal to a bottom of a package to be vertical to the bottom of the package; and a λ/4 waveplate configured to be disposed between the 45 degree partial reflection mirror and the wavelength selective filter.

The optical components may be disposed on a thermo-element which is placed on a bottom of a TO-can type package.

The 45 degree partial reflection mirror may show characteristics of partial reflection/partial transmission and have characteristics in that reflectance is greater than transmittance with respect to polarization of light which is emitted from the semiconductor laser diode chip, and show characteristics of total transmission or partial reflection/partial transmission and have characteristics that transmittance is greater than reflectance with respect to polarization which is perpendicular to the polarization of the light which is emitted from the semiconductor laser diode chip.

The wavelength selective filter may be an FP type etalon filter, and the wavelength selective filter may be manufactured by stacking a dielectric thin film having high refractive index and a dielectric thin film having low refractive index.

BRIEF DESCRIPTION OF THE DRAWINGS

FIG. 1 is an outside view of TO-type chirp managed laser according to the related art;

FIGS. 2A and 2B are schematic views illustrating that a difference of intensities of a signal "1" and a signal of "0" emitted from a laser diode chip changes an intensity ratio of the signal of "1" and the signal of "0" by a wavelength selective filter;

FIG. 3 is an outside view of chirp managed laser according to the related art having a mini-flat or butterfly type package according to the related art;

FIG 4 is a layout view of a TO-can type laser structure in which a wavelength selective filter according to the related art (U.S. 20150200730) is disposed;

FIG. 5 is a layout view showing a method of additionally disposing an optical isolator in the TO-can type laser structure in which the wavelength selective filter according to the related art (U.S. 20150200730) is disposed, in order to interrupt laser light reflected from the wavelength selective filter to be fed back to the laser diode chip;

FIG. 6 is a bird eye view of an example in which the laser diode chip, a collimating lens, and a 45 degree partial reflection mirror are disposed in a TO-can type package having a diameter of 6 mm or less;

FIG. 7 is a cross-sectional view of a TO-can type chirp managed laser in which an optical isolator according to the present invention is embedded;

FIG. 8 is a schematic specifically illustrating a method of effectively interrupting a feedback of light reflected from the wavelength selective filter to the laser diode chip using a 45 degree partial reflection mirror and a λ/4 waveplate having transmittance changed depending on polarization according to the present invention; and FIG. 9 is a graph showing transmittance/reflectance according to polarization of the 45 degree partial reflection mirror according to an exemplary embodiment of the present invention.

DETAILED DESCRIPTION

Hereinafter, exemplary embodiments of the present invention will be described in detail with reference to the accompanying drawings.

FIG. 7 shows an exemplary embodiment of the present invention.

A 45 degree partial reflection mirror used in the present invention allows polarization of light emitted from a laser diode chip to have reflection characteristics and allows polarization which is perpendicular to the light emitted from the laser diode chip to have transmission characteristics.

The light emitted from the semiconductor laser diode chip 100 typically has one linear polarization. In a TO-can type structure according to the present invention, the laser light emitted from the laser diode chip 100 is incident on the 45 degree partial reflection mirror 300 while having linear polarization of S-polarization. Here, the 45 degree partial reflection mirror 300 reflects most of the S-polarized light emitted from the laser diode chip to be transmitted to a wavelength selective filter 400. Light that is directly emitted from the laser diode chip 100 and transmits the 45 degree partial reflection mirror 300 is incident on a photo diode 600 that monitors intensity of the laser light, which is in turn used for monitoring optical intensity of the laser diode chip. Since a ratio of light that is directly emitted from the laser diode chip 100 and transmits the 45 degree partial reflection mirror 300 indicates energy which is not used for optical communications, it is preferable that about a ratio of lights for monitoring intensity of laser light is transmitted, and for this purpose, it is preferable that 70% or more of the light that is directly emitted from the laser diode chip 100 is reflected and 30% or less thereof is transmitted, and it is more preferable that light of about 93 to 97 % is reflected and light of about 3 to 7% is transmitted.

A λ/4 waveplate 450 serves to convert the linear polarization into circular polarization. FIG. 8 is a view showing a change of the above-mentioned polarization in detail. The light that is emitted from the laser diode chip in S-polarization and is reflected from the 45 degree partial reflection mirror arrives at the λ/4 waveplate while maintaining the S-polarization, which is polarization characteristics of when the light is emitted from the laser diode chip. The λ/4 waveplate has characteristics that convert the linear polarization into the circular polarization. Accordingly, light that passes through the λ/4 waveplate and moves to the wavelength selective filter has characteristics of right-handed circular polarization. Since light reflected from the wavelength selective filter has a rotation direction of polarization which is mirror-reflected, the light is changed from right-handed circular polarization to left-handed circular polarization to thereby arrive at the λ/4 waveplate. The λ/4 waveplate converts the left-handed circular polarization into light of linear polarization light of P-Polarization against 45 degree mirror. Therefore, the light that is reflected from the wavelength selective filter, passes through the λ/4 waveplate, and arrives at the 45 degree partial reflection mirror has characteristics P-polarization. As a result, the light that is emitted from the semiconductor laser diode chip and directly arrives at the 45 degree partial reflection mirror has characteristics of S-polarization, and the light that emitted from the semiconductor laser diode chip, passes through the 45 degree partial reflection mirror and the λ/4 waveplate, is reflected from the wavelength selective filter, again passes through the λ/4 waveplate, and then arrives at the 45 degree partial reflection mirror has characteristics of P-polarization. As such, the polarization characteristics of light are changed into S-polarization and P-polarization depending on a direction of light that arrives at the 45 degree partial reflection mirror.

FIG. 9 is a simulation result showing that the 45 degree partial reflection mirror has different transmittances and reflectances depending on polarization characteristics of light incident on the 45 degree partial reflection mirror. FIG. 9 shows that the 45 degree partial reflection mirror has reflectance of 70% or more with respect to S-polarization at a wavelength of 1535 nm, and the same 45 degree partial reflection mirror may transmit most of the light with respect to P-polarization.

Therefore, in FIG. 7, most of the light that is emitted from the laser diode chip 100 in S-polarization, passes through the collimating lens 200, and arrives at the 45 degree partial reflection mirror 300 may be emitted to the outside of the TO-can can type to be engaged in optical communication. The laser light reflected from the wavelength selective filter 400 is converted into P-polarization while passing through the λ/4 waveplate 450, to thereby arrive at the 45 degree partial reflection mirror 300, and since 45 degree partial reflection mirror transmits most of the light with respect to P-polarization unlike S -polarization, it is possible to effectively interrupt a feedback of the light reflected from the wavelength selective filter 400 to the laser diode chip 100. Therefore, a disturbance of the laser diode chip 100 by the light reflected from the wavelength selective filter 400 may be decreased, thereby improving quality of communication.

Although the present description describes an example in which the light emitted from the laser diode chip is S-polarization with respect to the 45 degree partial reflection mirror, the same effect may be implemented even if the light is emitted in P-polarization. Although a detailed description is omitted in the present invention, since the photo diode 500 monitors intensity of light reflected from the wavelength selective filter 400, it is possible to adjust a wavelength of laser light so as to have a constant relationship with a transmission wavelength band of the wavelength selective filter using a ratio of photocurrents flowing in two photo diodes 500 and 600.

Since an optical interruption device according to the present invention may effectively interrupt a light feedback to the laser diode chip by adjusting characteristics of the 45 degree partial reflection mirror in an existing TO-can type laser device having the 45 degree partial reflection mirror and additionally disposing one λ/4 waveplate, unlike an optical isolator according to the related art using an existing Faraday rotator, signals of "1" and "0" may be effectively adjusted in a TO-can type laser device having a small volume, thereby improving a function of communication. In addition, since the optical isolator according to the related art includes two polarizers, one Faraday rotator, and a permanent magnet surrounding them, the optical isolator has a large size and is expensive, while a light feedback interruption technology according to the present invention performs the same function as the existing optical isolator which has the large size and is expensive, and has characteristics that spatial and economical savings are possible, by adding one λ/4 waveplate.

As described above, according to the exemplary embodiments of the present invention, the light, which is the S-polarization in relation to the 45 degree partial reflection mirror, emitted from the laser diode chip is mainly reflected from the 45 degree partial reflection mirror, passes through the λ/4 waveplate and the wavelength selective filter, and is transmitted to the outside of the TO-can type package, thereby performing the function of optical communications. The light reflected from the wavelength selective filter becomes the light of P-polarization polarization while again passing through the waveplate, to thereby arrive the 45 degree partial reflection mirror. When the 45 degree partial reflection mirror has characteristics that transmit most of P-polarization, the light reflected from the wavelength selective filter to arrive at the 45 degree partial reflection mirror is not reflected from the 45 degree partial reflection mirror and is transmitted. Accordingly, since the light reflected from the wavelength selective filter is interrupted so as not to be fed back to the laser diode chip, the disturbance occurring from the laser diode chip may be removed.

As a result, according to the present invention, it is possible to effectively interrupt the feedback of the light reflected from the wavelength selective filter to the laser diode chip, using the 45 degree partial reflection mirror and one λ/4 waveplate having different reflectivity in relation to the P-polarization and the S-polarization, instead of the optical isolator that includes the two polarizers, the Faraday rotator, and the permanent magnet, is expensive, and has the large volume.

Therefore, such the chirp managed laser structure may be suitably used for the TO-can type laser package that has a small volume and is inexpensive.

All or some of the respective exemplary embodiments also be selectively combined with each other so that various modifications may be made.

In addition, it is to be noted that the exemplary embodiments are intended to be illustrated not intended to be limited. Also, it will be understood by those skilled in the art that various exemplary embodiments may be made within the technical scope of the present invention.

What is claimed is:

1. A semiconductor laser device having an optical isolator function, the semiconductor laser device comprising:
    a laser diode chip (100) configured to emit laser light;
    a wavelength selective filter (400);
    a collimating lens (200) configured to be installed on an optical path between the laser diode chip (100) and the wavelength selective filter (400) to collimate the light emitted from the laser diode chip (100);
    a 45 degree partial reflection mirror (300) configured to be installed on an optical path between the collimating lens (200) and the wavelength selective filter (400) to convert a direction of laser light which is moved to be horizontal to a bottom of a package to be vertical to the bottom of the package; and
    a λ/4 waveplate (450) configured to be disposed between the 45 degree partial reflection mirror (300) and the wavelength selective filter (400) to convert direct light of linear polarization which is emitted from the laser diode chip (100) into light of circular polarization and, light of circular polarization which is reflected by the wavelength selective filter (400) into reflected light of linear polarization,
    wherein (a) the direct light of linear polarization which is directly emitted from the laser diode chip (100) and (b) the reflected light of linear polarization, which is reflected from the wavelength selective filter, passes through the λ/4 waveplate, and arrives at the 45 degree partial reflection mirror are both perpendicular to one another.

2. The semiconductor laser device of claim 1, wherein the 45 degree partial reflection mirror (300) partially reflect or partially transmit and has characteristics that reflectance is greater than transmittance with respect to polarization of light which is directly emitted from the laser diode chip (100), and shows characteristics of total transmission or partial reflection/partial transmission and has characteristics that transmittance is greater than reflectance with respect to polarization which is perpendicular to the polarization of the light which is directly emitted from the laser diode chip (100).

3. The semiconductor laser device of claim 2, wherein the 45 degree partial reflection mirror (300) has reflectance of at least 70% with respect to light of polarization which is directly emitted from the laser diode chip (100).

4. The semiconductor laser device of claim 2, wherein the 45 degree partial reflection mirror (300) has transmittance of at least 70% with respect to light of polarization which is perpendicular to the polarization of the light which is directly emitted from the laser diode chip (100).

5. The semiconductor laser device of claim 1, wherein the wavelength selective filter (400) is an FP type etalon filter.

6. The semiconductor laser device of claim 1, wherein the wavelength selective filter (400) is manufactured by stacking a dielectric thin film having high refractive index and a dielectric thin film having low refractive index.

7. The semiconductor laser device of claim 1, further comprising a photo diode (500) for monitoring an optical wavelength configured to monitor intensity of light reflected from the wavelength selective filter (400) and to be attached onto a thermoelement (900).

8. The semiconductor laser device of claim 1, wherein the laser diode chip (100) is disposed on a thermoelement (900).

9. A laser device having an optical isolator function, the laser device comprising:
    a laser diode chip (100) configured to emit laser light;
    a wavelength selective filter (400);

a collimating lens (200) configured to be installed on an optical path between the laser diode chip (100) and the wavelength selective filter (400) to collimate the light emitted from the laser diode chip (100);

a 45 degree partial reflection mirror (300) configured to be installed on an optical path between the collimating lens (200) and the wavelength selective filter (400) to convert a direction of laser light which is moved to be horizontal to a bottom of a package to be vertical to the bottom of the package; and an optical isolator configured to be disposed on an optical path between the collimating lens (200) and the 45 degree partial reflection mirror (300) to prevent laser light reflected from the wavelength selective filter (400) from being fed back to the laser diode chip (100); and a $\lambda/4$ waveplate (450) configured to be disposed between the 45 degree partial reflection mirror (300) and the wavelength selective filter (400) to convert direct light of linear polarization which is emitted directly from the laser diode chip (100) into light of circular polarization and, light of circular polarization which is reflected in the a wavelength selective filter (400) into reflected light of linear polarization, wherein the (a) direct light of linear polarization, which is directly emitted from the laser diode chip (100) and the reflected light of linear polarization which is reflected from the wavelength selective filter, passes through the $\lambda/4$ waveplate, and arrives at the 45 degree partial reflection mirror are both perpendicular to one another.

10. The laser device of claim 9, wherein the laser diode chip (100) is disposed on a thermoelement (900).

* * * * *